US005369333A

United States Patent [19]

Inoguchi et al.

[11] Patent Number: 5,369,333

[45] Date of Patent: Nov. 29, 1994

[54] THIN FILM ELECTROLUMINESCENCE DISPLAY ELEMENT

[75] Inventors: Kazuhiro Inoguchi, Toyota; Masayuki Suzuki; Nobuei Ito, both of Chiryu; Tadashi Hattori, Okazaki, all of Japan

[73] Assignees: Nippondenso Co., Ltd., Kariya; Research Development Corporation of Japan, Tokyo, both of Japan

[21] Appl. No.: 953,068

[22] Filed: Sep. 29, 1992

[30] Foreign Application Priority Data

Sep. 30, 1991 [JP] Japan .................................. 3-280648

[51] Int. Cl.[5] ........................ H05B 33/14; H01L 33/00

[52] U.S. Cl. ...................................... 313/509; 428/690

[58] Field of Search ................................ 313/500–509; 428/690, 361; 427/66

[56] References Cited

U.S. PATENT DOCUMENTS

| | | | |
|---|---|---|---|
| 4,099,091 | 7/1978 | Yamazoe et al. | 313/509 |
| 5,055,363 | 10/1991 | Tomomura et al. | 313/506 |
| 5,220,243 | 6/1993 | Klinedinst et al. | 313/509 |

FOREIGN PATENT DOCUMENTS

| | | |
|---|---|---|
| 53-42398 | 11/1978 | Japan . |
| 62-108496 | 5/1987 | Japan . |
| 1241795 | 9/1989 | Japan . |

OTHER PUBLICATIONS

Kenkyo Jujuyoka Mokoku, vol. 36, No. 5, (1987) pp. 811–819 (with English Abstract).

Tannas, Jr, Flat-Panel Displays and CRTs 1985, pp. 247–250.

*Primary Examiner*—Alvin E. Oberley

*Assistant Examiner*—Steven J. Saras

*Attorney, Agent, or Firm*—Cushman, Darby & Cushman

[57] ABSTRACT

A thin film EL display element that excels in luminous efficiency, is stable, and has a superior service life, is provided. The thin film EL display element comprises a lower electrode, a first insulating film, a luminescent film, a second insulating layer, and an upper electrode formed on an insulating base substrate in this order; the second insulating layer comprises a thin film that is adjacent to the luminescent layer. The thin film comprises a sulfide or a selenide that does not form any sulfate or selenate.

11 Claims, 4 Drawing Sheets

THIN FILM ELECTROLUMINESCENCE DISPLAY ELEMENT

FIELD OF THE INVENTION

The present invention relates to a thin EL (electroluminescence) display element, and particularly to a stable thin film EL display element that has a high luminous efficiency and whose service life characteristics and other characteristics have not deteriorated.

DESCRIPTION OF RELATED ART

A thin film EL display element makes use of a phenomenon of luminescence of a fluorescent substance comprised of zinc sulfide (ZnS), selenium sulfide (ZnSe), alkaline earth sulfide (CaS, SrS, BrS, etc.), and the like as a luminescent matrix when an electric field applied thereto, which has been attractive as a self-luminous flat display element.

A typical cross-sectional view of such an element is shown in FIG. 1, in which case, parts of the luminescent layer have deteriorated owing to moisture in the air or because said layer has been washed with water. In FIG. 1, 1 denotes a substrate, 2 a lower electrode, 31 a first insulating film, 4 a luminescent layer, 32 a second insulating film and 5 an upper electrode.

In particular, the alkaline earth element sulfide is decomposed in air by the action of $CO_2$ and moisture. For this reason, the thin layer EL display element making use of an alkaline earth element sulfate as a matrix of the luminescent layer is problematic in terms of service life of, etc.

A method for the protection of the luminescent layer with a non-doped zinc sulfide (ZnS) having a film thickness of about 200 nm is commonly known.

A construction in which part or all of the insulating film in the vicinity of the luminescent layer protected with sulfides having high thermodynamic stability, i.e., sulfides of a metal element belonging to the group IIIb of the Periodic Table or of a rare earth element, or with an Se compound or Te compound is also commonly known.

On the other hand, in the case of a thin film EL display element using zinc sulfide (ZnS) as a luminescent matrix, although it is more stable than an alkaline earth element sulfide, it is still not resistant against water. Above all, in the case of a thin film EL display element in which an oxide film as an insulating film is formed on the luminescent layer by means of a reactive sputtering method, its luminous efficiency, service life, and other characteristics have been known to deteriorate.

Furthermore, as disclosed in Japanese Examined Patent Publication (Kokoku) No. 53-42398 entitled "ZnS Thin Film Luminescent Element and Production Thereof", a process has been proposed in which a second insulating film composed of a nitride (e.g. $Si_3N_4$, etc.) is formed on the luminescent layer or the whole thin film EL display element is encapsulated with a silicon oil, etc.

As described above, however, it is not essential tc protect the thin film EL display element using an alkaline earth element sulfide, etc. as the luminescent matrix with zinc sulfide or a sulfide of a IIIb group element or a rare earth metal. Specifically, the problems based on the characteristics inherent in zinc sulfide or the sulfide of a IIIb group element or a rare earth metal have not yet been solved. Consequently, such thin film EL display elements, more or less, are still unstable in water.

The thin film EL display element using $Si_3N_4$,etc., which is a nitride, on the luminescent layer in the vicinity thereof as the second insulating layer, has increased stability to water, but because of the small dielectric constant of $Si_3N_4$, etc., the voltage (partial voltage) to be applied to the luminescent layer is unduly low and for this reason, the problem involving the hig total driving voltage of the thin film EL display element remains.

SUMMARY OF THE INVENTION

The present invention is made for the purpose of solving these problems. The object of the present invention is to provide a thin EL display element having high luminous efficiency and exhibiting excellent stability and service life.

According to the present invention, the above object can be solved by a thin film EL display element that comprises a lower electrode, a first insulating film, a luminescent film, a second insulating layer, and an upper electrode, formed on an insulating base substrate in this order, characterized in that second insulating film includes a thin film that is adjacent to the luminescent layer. This thin film comprises a sulfide or a selenide that does not form any sulfate or selenate.

DISCLOSURE OF THE INVENTION

Figure 1:
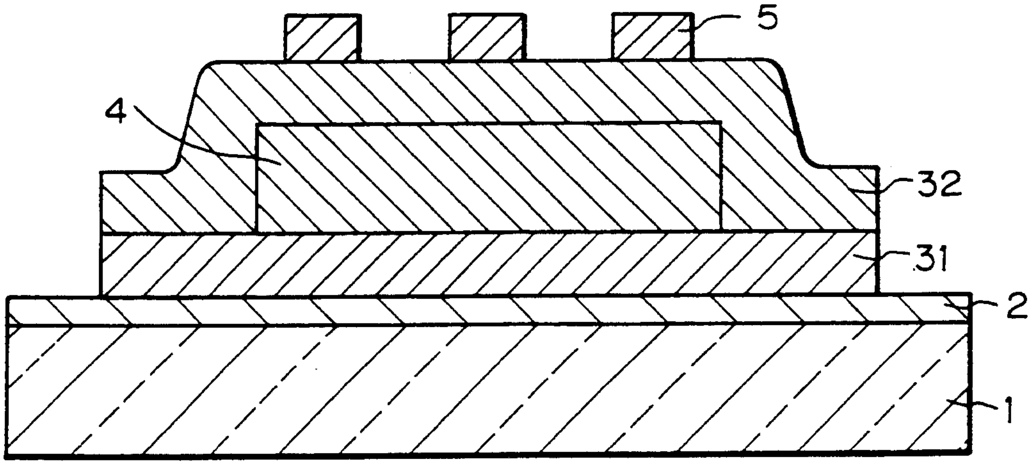
Fig. 1 PRIOR ART
FIG. 1 is a schematic view showing the cross-section of a conventional thin film EL display.

The thin film EL display element comprises a lower electrode, a first insulating film, a luminescent layer, a second insulating film, and an upper electrode, formed on an insulating base substrate in this order. Furthermore, part or whole of the second insulating film is composed of a thin film comprised of a sulfide or a selenide that does not form any sulfate or selenate, and it is placed adjacent to said luminescent layer.

The thin film EL display element is constructed as described above because we have clarified the cause of deterioration of the thin film EL display element using a luminescent layer comprising a sulfide or selenide such as zinc sulfide, zinc selenide, or an alkaline earth element sulfide as a matrix under the influence of moisture.

That is, we have discovered that in the case that the luminescent matrix, such as zinc sulfide, zinc selenide, or an alkaline earth element sulfide, is adjacent to an oxide film as an insulating film, particularly an oxide film produced in the presence of oxygen plasma, for example, by sputtering, highly water-soluble, unstable zinc sulfate ($ZnSO_4$) or zinc selenate ($ZnSeO_4$), depending on the luminescent matrix, is formed in a thin layer in the vicinity of the surface of the luminescent layer.

Conventionally, it is common that when zinc sulfate, etc. is oxidized, simple oxides (e.g. ZnO) are directly formed. However, in the oxidization of the sulfides such as ZnS, sulfur is not directly substituted with oxygen, but a composite oxide like zinc sulfate is first formed, and when sulfurous acid gas ($SO_2$) or sulfuric acid ($H_2SO_4$) is no longer present after being heated or in the presense of water, zinc oxide is then formed.

Consequently, it is preferable to use a material containing no oxygen, like a nitride, sulfide, or selenide as an insulating material adjacent to the luminescent layer.

However, in the case of a nitride (e.g., $Si_3N_4$), a firm adhesion can not be obtained as the nitride has neither an element common to nor a factor making a bond with the luminescent material.

When a pulse is repeatedly applied to such a thin film EL display in order to drive it, the amount of electric charge that can be injected to the luminescent layer is gradually reduced, thereby decreasing the brightness of the luminescence.

With regard to $Si_3N_4$, it has a high dielectric breakdown voltage, Eb, but has a dielectric constant, $\epsilon'$, as low as about 8.0. For this reason, the voltage (partial voltage) applied to the luminescent layer is lowered and, thus, a higher driving voltage is required in order to obtain the same luminescence.

On the other hand, the sulfides and selenides contain the same element as that contained in the luminescent layer, i.e., sulfur or selenium. For this reason, the sulfides or selenides can strictly adhere to the luminescent layer, and an electric charge can be introduced from the interface thereof to the luminescent layer.

However, the sulfides or selenides themselves should not form a sulfate or selenide by oxidation thereof, because when a back electrode is made of an oxide type transparent dielectric layer comprised of ITO [comprised. of indium oxide ($InO_2$) and tin oxide ($SnO_2$)] or zinc oxide, and when an oxide film is inserted as an insulating film having a high dielectric constant (for example, $Ta_2O_5$, $TiO_2$, $BaTa_2O_6$, $PbTiO_3$, PZT type high dielectric materials, etc.), they deteriorate in a manner as described above. Even if the back electrode is formed by a metal such as aluminum and no oxidize film is inserted, deterioration will gradually occur by the action of oxygen and carbon dioxide in the air and water.

This phenomenon is due to the advance of a chemical reaction and, thus, it is not possible to prevent such a phenomenon even when the material itself has high thermodynamic stability. For example, all of the sulfides or selenides of group IIIb elements and rare earth elements form sulfates or selenates. As described above, almost all of the metal elements are capable of forming the sulfide or selenide, but almost all of them also form sulfate or selenate.

The sulfides or selenides of silicon (Si) and germanium (Ge) do not form the corresponding sulfate and selenate, but they themselves are unstable and highly soluble in water.

Preferred examples of sulfides or selenides that do not form any sulfate or selenate are sulfides or selenides of molybdenum (Mo), technetium (Tc), tantalum (Ta), tungsten (W), rhenium (Re), and osmium (Os). They never form any sulfate or selenate even when exposed to a highly reactive oxygen plasma, etc, and they are directly decomposed by releasing sulfurous acid gas ($SO_2$). Furthermore, they are highly stable in air and insoluble in water.

Particularly, $TaS_x$ (where $x=1/6$ to 3) and $WS_x$ (where $x=1.5$ to 3) are stable when heated to 300° C. in air, and do not change when boiled in water.

When these sulfides or selenides are arranged so that they reside adjacent to the luminescent layer comprised of zinc sulfide, zinc selenide, or sulfides of an alkaline earth element metal as the luminescent matrix the formation of sulfate or selenate due to oxidation of the luminescent layer can be prevented and they can strictly adhere and bond to the luminescent layer via sulfur or selenium.

Since they never form sulfate or selenate by the oxidation, a transparent electro-conductive film of an oxide can be formed directly in contact with them. Moreover, they make it possible to insert an oxide film and thereby lower the driving voltage. Since they can be bonded with oxygen of the oxide film via a metal element at the interface to the oxide film, a strong adhesion can also be obtained thereat.

As one example of such a preferred matching, tantalum (Ta) sulfide (e.g., $TaS_2$) can be used at a region adjacent to a luminescent layer wherein Mn (which forms an amber colored thin film EL display) or TbOF (which forms a green colored thin film EL display) is doped in a luminescent matrix of zinc sulfide (ZnS), and an oxide film of $Ta_2O_5$-based is used as the insulating film.

The tantalum sulfides have a dielectric constant (relative permittivity) of about 130 to 240, which is far higher than that of $Si_3N_4$, which is about 8.0, and they possess a maximum storage charge ($Q_{max}$) of about 1.5 to 2.0 times higher than that of $Si_3N_4$, which is about 4 to 6 $\mu$c/cm$^2$. Here, $Q_{max=\epsilon \cdot Eb}[\mu C/cm^2]$, where $\epsilon=\epsilon' \cdot \epsilon_o$, $\epsilon'$ is dielectric constant, $\epsilon_o$ is dielectric constant in vacuum, and $E_b$ is dielectric breakdown voltage.

However, since Ta sulfides are originally black, light transmissivity is lowered if the film thickness thickened. Consequently, in the case one-sided luminesce display, Ta sulfides can contribute to the improvement of contrast as they become background color. Nevertheless, when a transmission-type thin film EL display element is desired, the film thickness should be thin. Moreover, in the case where the film thickness is too thin, a breakdown voltage tolerance is insufficient at the above clamping electric field of the luminescent layer and, thus, this should be supplemented by another insulating layer. In the case of obtaining such a transmission-type thin film EL display element, an oxide film having a high dielectric constant is effective. For example, $Ta_2O_5$ (density of maximum storage charge: about 4–6 $\mu$c/cm$^2$) has a dielectric constant of 20–25, which is, for example, higher than that (about 6.5–15) of the luminescent layer comprising zinc sulfide as the luminescent matrix. Accordingly the driving voltage of the thin film EL display is advantageously reduced and, at the same time, the breakdown voltage tolerance is advantageously increased.

Of course, the higher the dielectric constant of the oxide layer to be inserted is, the more the driving voltage of the thin film EL display element is lowered. At the same time, it is needless to say that the oxide layer should be transparent and have a high performance index.

A preferably film thickness for obtaining a transmission-type thin film EL display according to the present invention is not more than 30 nm.

As described above, according to the present invention, the sulfides or selenides, which never form any sulfate or selenate thereby causing a deterioration of the thin film EL display element are arranged at a place adjacent to the luminescent layer comprising a sulfide or selenide as a luminescence material matrix, particularly at a place where it is in contact with the upper portion of the luminescent layer, and for this reason, the sulfides or selenides can be prevented from forming harmful sulfate or selenate even on the surface of the luminescent layer, resulting in a highly reliable stable thin film EL display element.

In addition, the sulfides or selenides, specifically any sulfide or selenide of Mo, Tc, Ta, W, Re, and Os, can be strictly bonded to the luminescent layer via an element thereof common to that of the matrix material of the luminescent layer, i.e. sulfur or selenium. Consequently, the electric charge deposited at the interface of the sulfide or the selenide can effectively be injected into the luminescent layer, and thus, luminous efficiency can be improved.

What is more, since the sulfides or selenides have a much higher dielectric constant than that of the luminescent layer, the partial voltage applied on the luminescent layer may be increased. Accordingly, the present invention has the advantage of being able to lower the driving voltage of the thin film EL display.

Moreover, in the case of the sulfides of, e.g., Ta, etc, which are black, they can be used as the black colored layer for background color at the same time if the film thickness is set to be not less than 300 nm, whereby the contrast of the thin film EL display element can be improved.

Conversely, when the film thickness of the sulfides or selenides is set to be thin, a transmission-type thin film EL display element can be constructed. In this case, low voltage driving can be realized and, at the same time, another insulating film to supplement the breakdown voltage tolerance can be inserted even if it is an oxide film that forms harmful sulfate or selenate when directly in contact with the luminescent layer. For example, in the case where an oxide film by reactive sputtering is formed on the sulfites or selenides, even if oxidation occurs on the surface of the sulfides or selenides, the oxidized substance is sulfite gas to be released. Accordingly, the surface thereof is always refreshed and, thus, no sulfate or selenate is formed thereon. Moreover, in the sulfides or selenides according to the present invention, e.g. in the case of $TaS_x$, which is a sulfide of Ta, since various solid solutions can be formed within the value of x from 1/6 to 3 [$Ta_6S$, $Ta_2S$, 2S-$Ta_{1+x}S_2$ (x=0.2 to 0.35), 6S-Ta $_{1+x}S_2$ (x=0.2), 3S-$Ta_{1+z}S_2$ (x=0.15), 1S-$TaS_2$, α-$TaS_2$, 2S-$TaS_2$, β-$TaS_3$, 3S-$TaS_2$, 6S-$TaS_2$, δ-$TaS_2$, $TaS_3$, and intermediates thereof], even if several ten angstroms of the surface layer are converted into sulfite gas to vent S out somewhat, no serious problem will occur. Moreover, since the metal element that makes up the sulfides or selenides can be bonded to oxygen, it can conversely strictly adhere to the oxide layer via the oxygen.

Figure 3:
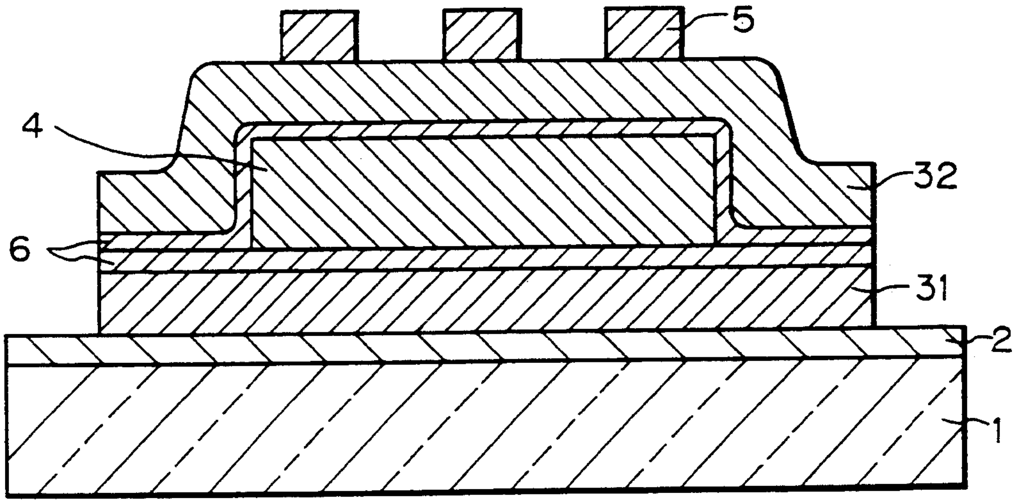
FIG. 3 is a schematic view showing the cross-section of a thin film EL display element according to another embodiment of the present invention.

By covering the whole (including the sides) of the element with the sulfides or selenides according to the present invention, excepting a taking-out portion of the lower electrode, the formation of sulfides or selenates harmful to the luminescent layer on the surface thereof can be prevented. More preferably, the sulfides or selenides are advantageously inserted into a portion between the luminescent layer and the first insulating film in the vicinity of the lower side of the luminescent layer as shown in FIG. 3. In this case, when the upper and lower constructions are arranged as to be symmetrically interposed with the luminescent layer, the symmetry of the alternating driving pulse is maintained to thereby enhance the service life. Here, if the symmetry of electric properties, etc. can be maintained, the constructional symmetry is not necessarily required, and when a black colored sulfide or selenide is used among the sulfides and selenides, it is natural to consider the film thickness at the side where the light is emitted, i.e. transmissivity.

[General description of the material of the luminescent layer, particularly dopants, etc.]

Examples of luminescent material include ZnS:Mn (orange), ZnS:$TbF_3$ (green), ZnS:TbOF (green), ZnS:$SnF_3$ (red), ZnS:$SmCl_3$ (red), ZnS:$PrF_3$ (white), ZnS:$NdF_3$ (orange), ZnS:$EuF_3$ (pink), ZnS:$DyF_3$ (yellowish white), ZnS:$HoF_3$ (pink), ZnS:$ErF_3$ (green), ZnS:$TmF_3$ (blue), ZnS:$YbF_3$ (red), ZnS:Cu,Cl (green), ZnS:Cu,Au (green), ZnS:Ag,Cl (blue), SrS:Ce,Cl (blueish green), CaS:$CeCl_3$ (green), CaS:Eu,Cl (red), SrS:Ce,K,Eu (white), SrS:Ce (blueish green), BaS:Eu, ZnSe:Mn, (ZnSe:Ni, ZnSe:Co). Matrix materials may be other S, Se, Te—containing compounds or substances such as CdS, ZnSe, CdSe, ZnTe CdTe, etc.,; depants may be also Cu, Ag, Ga, Ir, Cl, Br, In, etc.

As described above, the positioning of the sulfide or selenide that does not form any sulfate or selenate, having numerous variations and merits, on a place adjacent to the luminescent layer, can provide a thin film EL display element excellent in luminous efficiency and stable and having a superior service life.

EXAMPLE

The present invention will now be described in greater detail by referring to specific embodiments.

Figure 2:
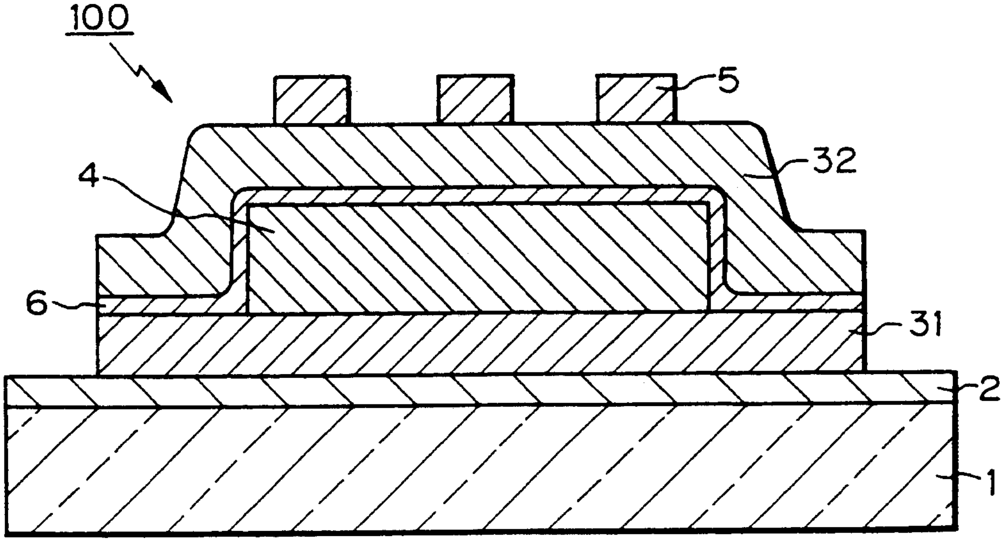
FIG. 2 is a schematic view showing the cross-section of a thin film EL display element according to one embodiment of the present invention.

FIG. 2 shows a schematic view showing the cross-section of a thin film EL display element 100 according to the present invention.

The thin film EL display element 100 is constructed so that the following films are sequentially formed on a glass plate 1 (thickness: 1.1 mm, produced under the trade name NA 40 by HOYA: non-alkaline glass), which is an insulating base substrate.

On the glass substrate 1 are formed a lower electrode 2 composed of an ITO (indium tin oxide) transparent electric conductive film, a first insulating film 31 composed of a tantalum pentoxide ($Ta_2O_5$) thin film, a luminescent layer 4 composed of zinc sulfide (ZnS) as the matrix material, a thin film 6 composed of sulfide of Ta which do not form any sulfate (hereinafter referred to as "$TaS_x$"), a second insulating film 32 composed of a tantalum pentoxide ($Ta_2O_5$) thin film, and a back electrode 5 composed of an A1 film.

Now, the method for manufacturing the above-numerated thin film EL display element 100 will be described.

The ITO was deposited on the glass substrate 1 with a thickness of 200 nm by sputtering in an atmosphere of an argon (Ar)/oxygen (O) mixture gas, and the transparent lower electrode having a stripe in the X direction, which is in a horizontal direction in the figure, was formed by wet-etching.

Subsequently, the first insulating film 31 was formed on the lower electrode 2 using $Ta_2O_5$ as a target by means of radio frequency sputtering in an atmosphere of an argon/oxygen mixture gas. The thickness of this film was 400 nm.

On the first insulating film 31, the luminescent layer 4 was formed by means of radio frequency sputtering in a mixed gas comprising 60% argon and 40% helium (He) using zinc sulfide (ZnS) containing TbOF in a proportion of 3.6% by weight as a target. The deposited luminescent layer 4 had a thickness of 700 nm.

On the luminescent layer 4, the $TaS_x$ thin film was formed by radio frequency sputtering tantalum disulfide ($TaS_2$) block powder having a particle size of under 325 mesh and a purity of 99.9% (produced by Soekawa Rikagaku Kabushiki Kaisha) incorporated in a quartz Petri dish in a mixed gas comprising 55% argon, 5% hydrogen sulfide and 40% helium, to a thickness of 100 nm.

The second insulating film 32 of $Ta_2O_5$ having a thickness of 400 nm was formed in a manner similar to the first insulating layer 31.

Further, an aluminum film was formed thereon by means of electron beam evaporation, and the back electrode 5 having a stripe in the Y direction, corresponding to a vertical direction in the figure, was formed by means of photo-etching. Consequently, the luminescent layer 4 at the portions crossing the lower electrode 2 and the back electrode 5 seen from the above allow a light to be emitted as dots.

For comparison, a thin film EL display element having a known construction was produced by inserting a 100 nm thick silicon nitride thin film by means of radio frequency sputtering in an argon/nitrogen mixture gas atmosphere using silicon as a target instead of the $TaS_x$ thin film.

Furthermore, when a thin film EL display element having neither the $TaS_x$ thin film nor the silicon nitride inserted therein as shown in FIG. 1 was produced for comparison, an interfacial exfoliation between the luminescent layer 4 and the second insulating layer 32 was caused, thereby preventing an element to be obtained.

Figure 4:
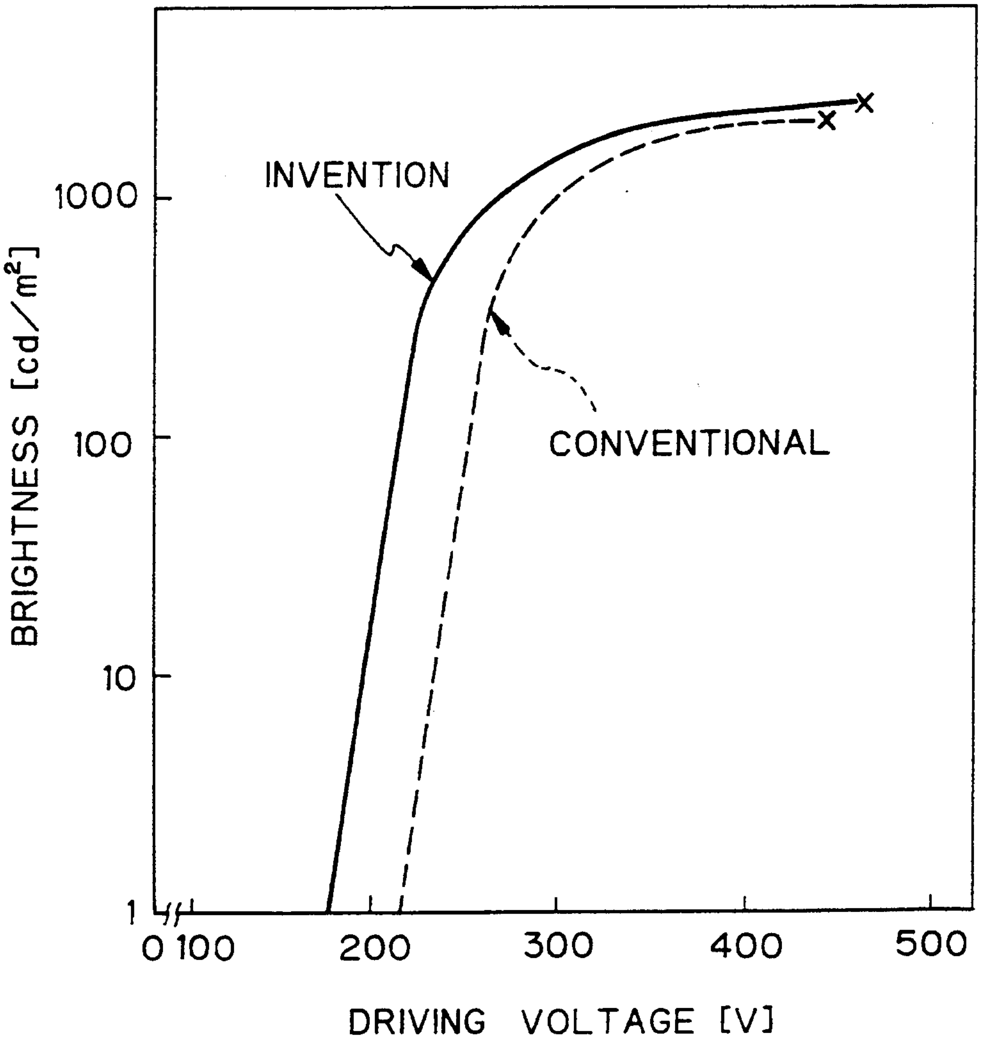
FIG. 4 is a drawing that shows the results of the relation between the luminescence and the driving voltage measured for a thin film EL display element according to the present invention and a conventional element.

FIG. 4 shows the results of the relation between the luminescence brightness and the driving voltage measured for the thin film EL display element having the $TaS_x$ thin film of the present invention and for the conventional thin film EL display element in which the silicon nitride had been inserted for comparison. As for the conditions of the measurement, the wave form of applied voltage recommended by the 125th Committee of the Japan Society for the Promotion of Science, i.e. 1 kHz bipolar pulse wave form, was used, the half peak width of the pulse ($\tau$) was 40 $\mu$s, the rise time of the pulse (tr) and the time of the pulse (tr) were both 8 $\mu$s, and the driving voltage was represented at the peak value.

As can be understood from the figure, the product of the present invention could reduce the luminescence starting voltage (voltage where the luminescence brightness has a value of 1 cd/m$^2$) by about 37 V in comparison with that of the conventional product, and could enhance the breakdown voltage tolerance (voltage difference of element rupture voltage minus the luminescence starting voltage) by about 57 V in comparison with that of the conventional product. Furthermore, even when both had the same luminescent layer, the product of the present invention had a higher luminous efficiency because it can take a larger amount of mobile electric charge, and the maximum luminescence brightness being about 15% higher than that of the conventional product.

When similar elements were prepared using tungsten sulfides ($WS_2$, $WS_3$), molybdenum sulfide ($MoS_2$), and rhenium sulfides ($RES_2$, $Re_2S_7$), instead of tantalum sulfides, effects similar to the those of tantalum sulfides were obtained, respectively.

Although the combination of ZnS and TaOF, which emits green light, was used as the luminescent material in the above description, similar effects were obtained when the combination of ZnS and Mn, which emits an amber light and ZnS and SmFs, which emits a red light, were used.

Figure 5:
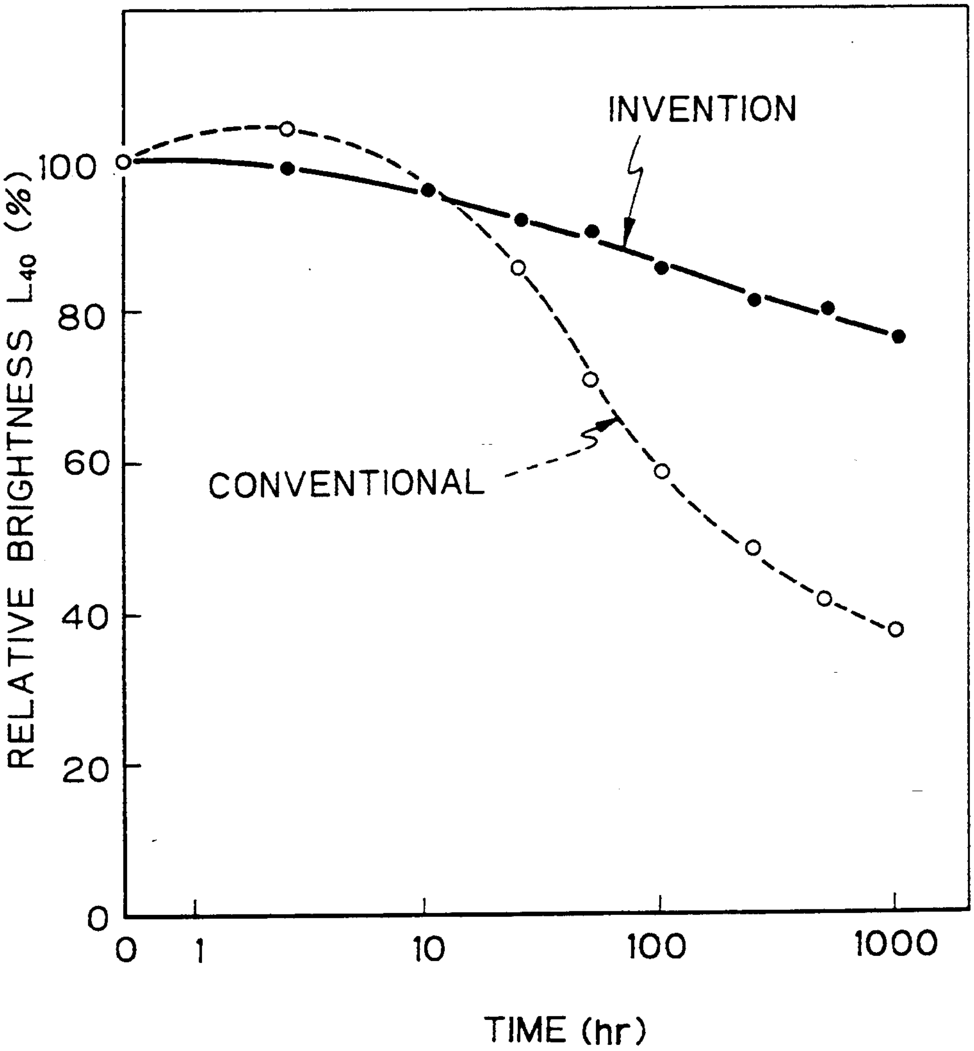
FIG. 5 is a drawing that shows the results from which the variations of luminescence with the elapse of time were measured for a thin film EL display element according to the present invention and a conventional article.

FIG. 5 shows the results from the thin film EL display element 100 of the present invention and the conventional element when they were driven at 1 kHz of the bipolar pulse wave form over a period of 1000 hours, and changes of the luminescence brightness with the elapse of time were measured.

Since there is a difference in the luminescence starting voltage (Vth), respective driving voltages were made to be values of the luminescence starting voltages plus 40 V (i.e., 218 V in the case of the present product and 255 V in the case of the conventional product) so that the measurements were started at values where the luminescence brightness were almost equal to each other. The ordinate represents a relative luminescence brightness expressed as a percentage (%) of $L_{40}$ (the luminescence brightness at the luminescence starting voltage+40 V) taking the initial luminescence brightness as 100%.

While in the conventional product the luminescence brightness was reduced to half with the time elapse of about 200 hours, the product of the present invention maintained about 75% of the initial luminescence brightness even after a lapse of time of 1000 hours.

We claim:

1. A thin film EL display element comprising: a lower electrode; a first insulating film a luminescent layer; a second insulating film; and an upper electrode disposed on an insulating base substrate in this order, said second insulating film including a thin film that is adjacent to at least a portion of a surface of said luminescent layer, said thin film comprising à sulfide or a selenide that does not form any sulfate or selenate.

2. The thin film EL display element according to claim 1, wherein said luminescent layer comprises a sulfide or selenide as a matrix material thereof.

3. The thin film EL display element according to claim 1, wherein said sulfide or selenide that does not form any sulfate or selenate is at least one member selected from the group consisting of sulfides and selenide of molybdenum, technetium, tantalum, tungsten, rhenium, and osmium.

4. The thin film EL display element according to claim 1, wherein said thin film comprised of a sulfide or a selenide that does not form any sulfate or selenate comprises at least one member selected from the group consisting of $TaS_x$, where x=1/6 to 3, and $WS_x$, where x =1.5 to 3.

5. The thin film EL display element according to claim 1, wherein said thin film is adjacent to said luminescent layer such that said thin film covers an entire surface of said luminescent layer, said entire surface of said luminescent layer corresponding to a surface of said luminescent layer that is proximate to said second insulating film.

6. The thin film EL display element according to claim 1, wherein said first insulating film includes a portion that is adjacent to said luminescent layer, said portion of said first, insulating film comprising a sulfide or selenide that does not form any sulfate or selenate.

7. The thin film EL display element according to claim 6, wherein said first insulating film is a laminate of an insulating layer and said portion of said first film adjacent to said luminescent layer comprises a sulfide or selenide that does not form any sulfate or selenate.

8. The thin film EL display element according to claim 7, wherein said first insulating film has a dielectric constant higher than that of said luminescent layer.

9. The thin film EL display element according to claim 1, wherein said second insulating film comprises a laminate of an insulating layer superimposed on said thin film.

10. The thin film EL display element according to claim 9, wherein said second insulating film has a dielectric constant higher than that of said luminescent layer.

11. A thin film EL display element comprising a lower electrode; a first insulating layer; a luminescent layer; a second insulating layer and an upper electrode formed on an insulating base substrate in this order, wherein at least a part of said second insulating layer comprises, as a main component, at least one member selected from the group consisting of sulfides and selenides of molybdenum, technetium, tantalum, tungsten, rhenium and osmium.

* * * * *